(12) United States Patent
Wang et al.

(10) Patent No.: US 10,763,660 B2
(45) Date of Patent: Sep. 1, 2020

(54) DUAL USE VEHICULAR AC GENERATOR

(71) Applicant: Ford Global Technologies, LLC, Dearborn, MI (US)

(72) Inventors: Chih-Lun Wang, Canton, MI (US); Tianbo Xu, Canton, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 312 days.

(21) Appl. No.: 15/812,076

(22) Filed: Nov. 14, 2017

(65) Prior Publication Data

US 2019/0148929 A1 May 16, 2019

(51) Int. Cl.
*H02H 3/16* (2006.01)
*B60L 50/10* (2019.01)
*G01R 27/20* (2006.01)
*B60L 53/16* (2019.01)
*H02H 3/33* (2006.01)
*H01H 3/14* (2006.01)
*B60L 3/04* (2006.01)

(52) U.S. Cl.
CPC ............ *H02H 3/162* (2013.01); *B60L 50/10* (2019.02); *B60L 53/16* (2019.02); *G01R 27/20* (2013.01); *B60L 3/04* (2013.01); *H01H 3/14* (2013.01); *H02H 3/16* (2013.01); *H02H 3/33* (2013.01)

(58) Field of Classification Search
USPC .......................................................... 361/42
See application file for complete search history.

(56) References Cited

U.S. PATENT DOCUMENTS

| | | | |
|---|---|---|---|
| 5,416,691 A | 5/1995 | Croughwell | |
| 6,040,969 A * | 3/2000 | Winch | H02H 11/002 307/127 |
| 6,850,043 B1 | 2/2005 | Maddali | |
| 9,651,014 B2 | 5/2017 | Brandon et al. | |
| 2004/0001292 A1 * | 1/2004 | Vanderkolk | H02H 3/33 361/42 |
| 2009/0147415 A1 * | 6/2009 | Lazarovich | G01R 31/025 361/42 |
| 2017/0259669 A1 * | 9/2017 | Eckert | B60L 3/0069 |

* cited by examiner

*Primary Examiner* — Danny Nguyen
(74) *Attorney, Agent, or Firm* — David B. Kelley; Brooks Kushman P.C.

(57) ABSTRACT

A vehicle includes an Alternating Current (AC) source, a receptacle, and a switch. The AC source has a line and neutral potential. The receptacle is carried by a body of the vehicle and includes line, neutral, and ground conductors, and a ground fault interrupter (GFI) circuit. The switch is coupled between the AC source and the GFI circuit configured to selectively short the neutral and ground conductors.

18 Claims, 4 Drawing Sheets

DUAL USE VEHICULAR AC GENERATOR

TECHNICAL FIELD

This application generally relates to a power system for a vehicle.

BACKGROUND

Conventional vehicles and some electrified vehicles such as hybrid-electric vehicles (HEVs) rely on an internal combustion engine for multiple purposes including providing power for propulsion, hydraulic systems, and to generate electric power.

SUMMARY

A vehicle includes an Alternating Current (AC) source, a receptacle, and a switch. The AC source has a line and neutral potential. The receptacle is carried by a body of the vehicle and includes line, neutral, and ground conductors, and a ground fault interrupter (GFI) circuit. The switch is coupled between the AC source and the GFI circuit configured to selectively short the neutral and ground conductors.

A method, by a controller, of controlling an Alternating Current (AC) generator for a vehicle includes shorting, via a switch, a neutral line with a ground line of a receptacle carried by a body of the vehicle. The method further includes, responsive to a difference between a line current and a neutral current exceeding a threshold, opening the switch, outputting a home connection mode signal, and disabling an isolation monitor between a neutral line and ground of the receptacle.

A vehicle includes an inverter, a receptacle, and a switch. The inverter is configured to output Alternating Current (AC) power at a line and neutral potential. The receptacle is carried by a body of the vehicle and includes line, neutral, and ground conductors, and a ground fault interrupter (GFI) circuit. The switch is coupled between the inverter and the GFI circuit configured to selectively short the neutral and ground conductors.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

In a traditional portable generator, either the Neutral conductor is electrically connected to the module frame (e.g., chassis or ground) or the Neutral is not electrically connected and "floating" (e.g., isolated from the chassis or ground). For use with a normal job site standalone load (e.g., portable drill, circular saw, miter saw, table saw, oscillating saw, lighting units, solder iron, electric water pump, or other electric appliance) either wiring configuration will properly drive the load. However, the Occupational Safety and Health Administration (OSHA) requires that the GND and Neutral conductors be electrically connected and also requires a Ground Fault Circuit Interrupter (GFCI) (also referred to as ground fault interrupter or GFI) for job site use. Further, when connecting the AC generator to a residential house or commercial building for emergency use when the Neutral conductor is electrically connected with the ground conductor, the connection or bonding will create two parallel paths for current to return to the AC source. The dual parallel path return will be detected by the GFI circuit and often result in tripping of the GFI circuit. Therefore, for a generator to be used to power a residential house or commercial building in an emergency, the operator must disconnect the neutral conductor from the ground. Here, this disconnection is accomplished via a transfer switch to separate the neutral and ground allowing proper operation with the residence while still being able to meet OSHA requirements for job site loads.

Figure 1:
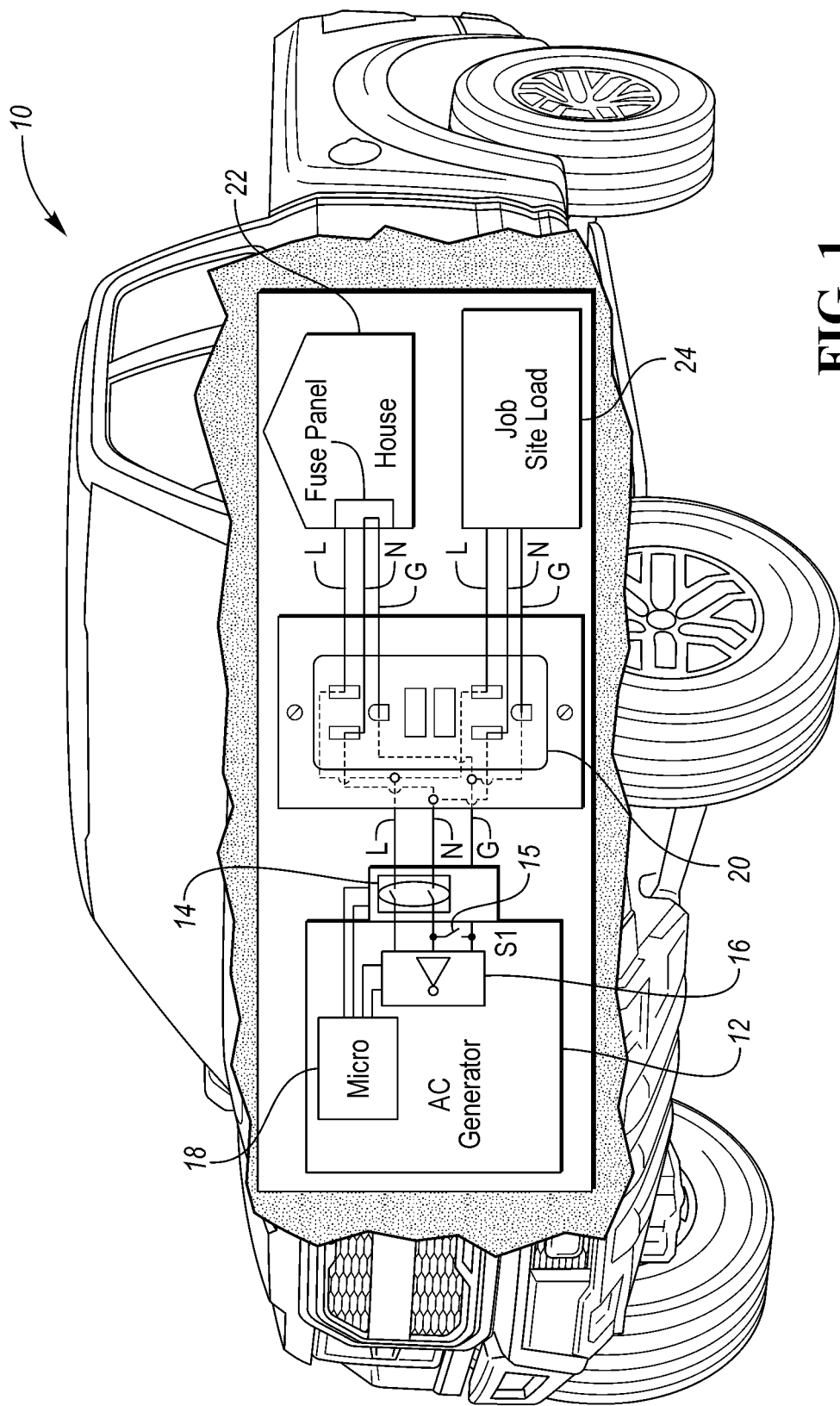
FIG. 1 is a diagram of a power system for a vehicle.

FIG. 1 is a diagram of an Alternating Current (AC) source power system for a vehicle 10. The vehicle 10 includes an AC generator 12 coupled with a Ground Fault Interrupter (GFI) circuit 14 and a switch 15 coupled between a neutral conductor (N) and a ground conductor (G). The AC generator 12 also may include an isolation monitor 16 and a controller 18. The controller may control the contactors in the GFI circuit, the isolation monitor, or the switch 15. The Line, Neutral, and Ground conductors may be electrically connected with a receptacle 20. The receptacle 20 is shown as an NEMA 5-20R but it may be of any common standard including grounded versions of international electrical receptacles such as NEMA 5-15R, 5-20R, 6-15, 6-20, L6-15, L6-20, L6-30, L5-30R, L14-30R, JIS C 8303, a CEE7/4 Schuko, a CEE7/16, a BS-1363, AS-3112, CEI 23-16, SEV-1011, SRAF 1962/DB, SI 32, IS 16A-R, BS-546, and other commonly available electrical receptacle. The receptacles are typically designed to meet certain requirements, for example many receptacles in the United States of America are designed to meet the standards of the U.S. National Electrical Manufacturers Association (NEMA). The vehicular system is configurable to supply power to a job site load 24 or in the event of an emergency to a residential house 22 or commercial building.

Here a selectable switch (S1) 15 typically a normally ON switch is connected between the Neutral conductor and the ground (GND) conductor. In a first state, the switch S1 15 is closed and the isolation monitor is turned off. In this first state, ground fault protection is performed by the GFI circuit by detecting any leakage ground current. If switch S1 15 fails in an open circuit condition, the isolation monitor function may be resumed such that the user still has protection from a ground fault. In the second state, the switch S1 15 is open and the isolation monitor provides protection from a ground fault. Additionally, there may be an added "Home Connection Mode" allowing the user to select and open switch S1 15. During operation, if the user did not select the second mode (i.e., Switch S1 15 open) before connecting to a house, then the GFI circuit may trip. Here, a controller may send a signal to a vehicular system such as a system information center, infotainment center, driver information counsel, or to a mobile device (e.g., mobile phone, tablet, smart watch, etc.) through a vehicle system such as a telecommunication unit (e.g., via cellular, wireless, or other infrastructure). The signal can show that the GFI is tripped and asked the customer "Are you connected to the house?". Customer has to answer the question before resetting the generator and restart. If the answer is Yes, then the controller may output a message to instruct the user to select the "Home Connection Mode" by opening switch S1 15 before restarting the AC generator. If customer still does not open switch S1 15, the controller may after a predetermined number of GFI trip events (e.g., after 5 trip events in a single vehicle key cycle), open switch S1 15 and monitor the isolation monitor such that the isolation monitor provided fault protection.

By opening the switch S1 15, the system becomes isolated from the ground (e.g., floats). When the system is floating, the isolation monitor of Neutral to Ground may be turned OFF due to the house connection, but the Line to Ground isolation monitor may still actively protect the customer from any HV leakage. The GFCI is now working as a secondary fault protection system because ground is no longer a low impedance return path for fault current. It should be noted that the GFCI can still trip when the fault current is passing through the ground path. (Secondary internal fault)

Figure 2:
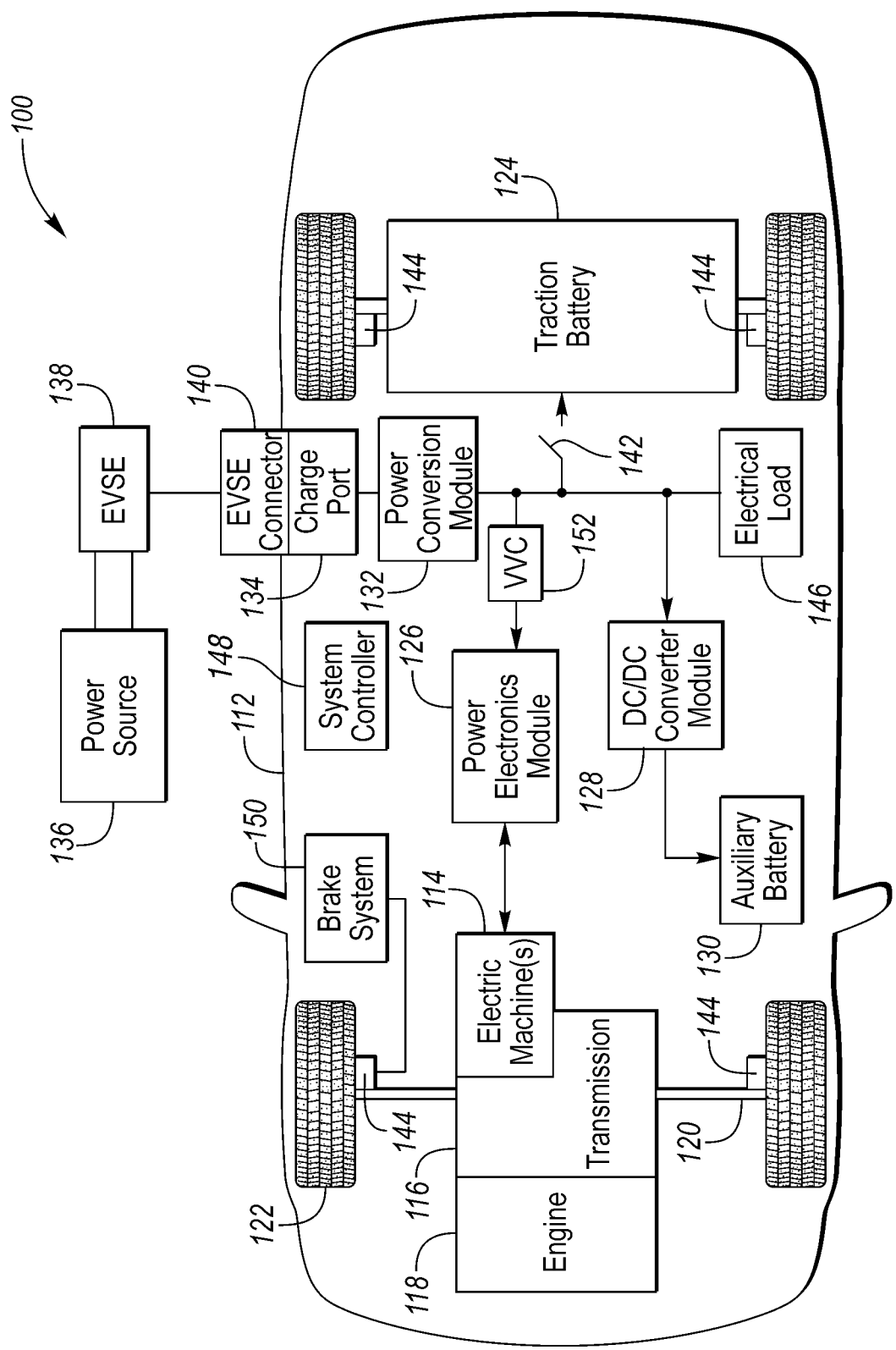
FIG. 2 is a diagram of a hybrid vehicle illustrating typical drivetrain and energy storage components.

FIG. 2 depicts a vehicle, and specifically an electrified vehicle (EV) 112 that may be referred to as a plug-in hybrid-electric vehicle (PHEV). Although a PHEV is illustrated in FIG. 2, the concepts also apply to traditional vehicles as elements of a traditional vehicle are a sub-set of the components shown in the PHEV 112. Here, a plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the PHEV 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A traction battery or battery pack 124 stores energy that can be used by the electric machines 114. The vehicle battery pack 124 may provide a high-voltage direct current (DC) output. The traction battery 124 may be electrically coupled to one or more power electronics modules 126. One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) 152 electrically coupled between the traction battery 124 and the power electronics module 126. The VVC 152 may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high-voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more high-voltage electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 2 but it may be implied that the vehicle network may connect to any electronic module that is present in the vehicle 112. A vehicle system controller (VSC) 148 may be present to coordinate the operation of the various components.

Often the VVC 152 is configured as a boost converter. The VVC 152 may include input terminals that may be coupled to terminals of the traction battery 124 through the contactors 142. The VVC 152 may include output terminals coupled to terminals of the power electronics module 126. The VVC 152 may be operated to cause a voltage at the output terminals to be greater than a voltage at the input terminals. The vehicle 112 may include a VVC controller that monitors and controls electrical parameters (e.g., voltage and current) at various locations within the VVC 152. In some configurations, the VVC controller may be included as part of the VVC 152. The VVC controller may determine an output voltage reference, $V_{dc}^*$. The VVC controller may determine, based on the electrical parameters and the voltage reference, $V_{dc}^*$, a control signal sufficient to cause the VVC 152 to achieve the desired output voltage. In some configurations, the control signal may be implemented as a pulse-width modulated (PWM) signal in which a duty cycle of the PWM signal is varied. The control signal may be operated at a predetermined switching frequency. The VVC controller may command the VVC 152 to provide the desired output voltage using the control signal. The particular control signal at which the VVC 152 is operated may be directly related to the amount of voltage boost to be provided by the VVC 152.

With reference to FIG. 2, the VVC 152 may boost or "step up" the voltage potential of the electrical power provided by the traction battery 124. The traction battery 124 may provide high-voltage (HV) DC power. In some configurations, the traction battery 124 may provide a voltage between 150 and 400 Volts. The contactor 142 may be electrically coupled in series between the traction battery 124 and the VVC 152. When the contactor 142 is closed, the HV DC power may be transferred from the traction battery 124 to the VVC 152. The VVC 152 may receive the HV DC power and boost or "step up" the voltage potential of the input voltage according to the duty cycle. Often an output capacitor is electrically coupled between the output terminals of the VVC 152 and the input of the power electronics module 126 to stabilize the bus voltage and reduce voltage and current ripple at the output of the VVC 152.

Figure 3:
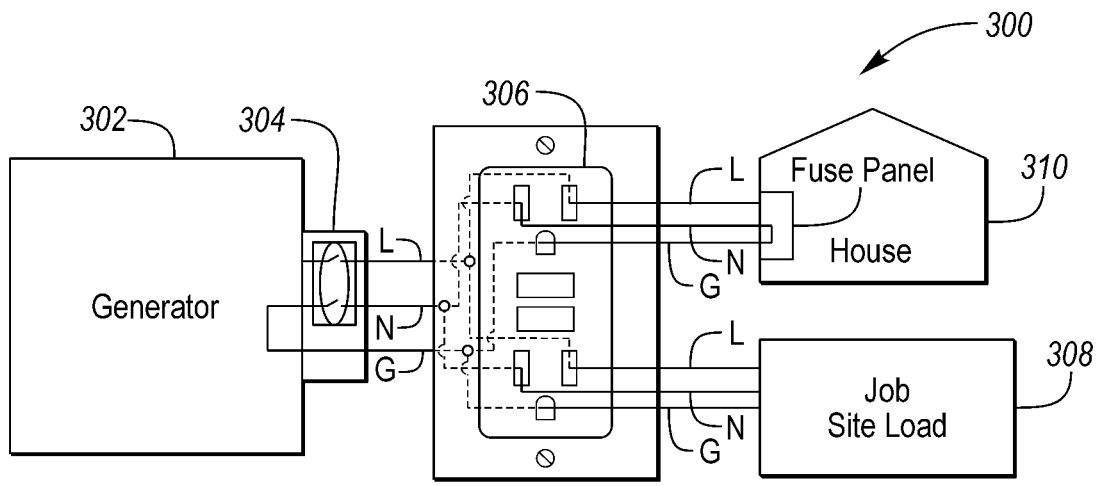
FIG. 3 is a schematic diagram of a generator connection with neutral and ground connected.

FIG. 3 is a schematic diagram of a generator system 300 for a vehicle having a connection between neutral and ground conductors. The AC generator 302 is coupled with a Ground Fault Interrupter (GFI) circuit 304 and a receptacle 306 in which the neutral conductor (N) and ground conductor (G) are electrically connected (e.g., shorted or bonded together) as required by the Occupational Safety and Health Administration (OSHA) for job site use 308. However, when connected to a residential house 310 for emergency use, the Neutral-Ground bonding will create two parallel paths for current return, that may trip the GFI circuit. In the event of an emergency, a user would have to un-bond the tie point or use special transfer switch that separate the neutral and ground to allow proper operation with the house. Typically requiring an electrician.

Figure 4:
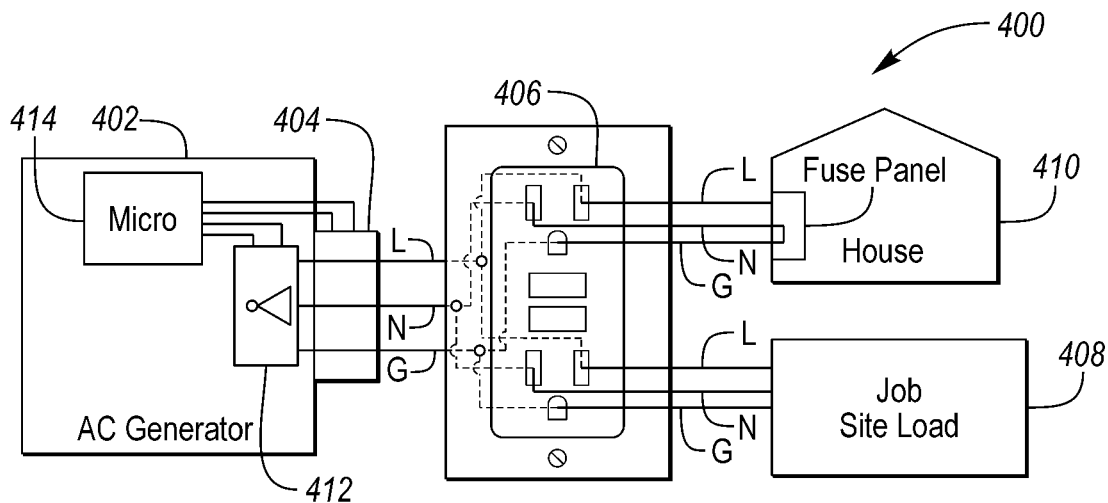
FIG. 4 is a schematic diagram of a generator connection with an isolation monitor to detect line to ground and neutral to ground faults.

FIG. 4 is a schematic diagram of a generator system 400 with an isolation monitor 412 to detect line to ground and neutral to ground faults. The AC generator 402 is coupled with a Ground Fault Interrupter (GFI) circuit 404 and a receptacle 406 in which the neutral conductor (N) and ground conductor (G) are electrically isolated (e.g., floating) . The AC generator further includes an isolation monitor 412 coupled with a controller 414. The system with a floating Neutral conductor is functional at both job site use 408 and a residential house connection 410. However, this configuration does not meet OSHA requirements. Additionally, other protection mechanisms to monitor the isolation status may be required in the event a High-Voltage is present on the ground in which a traditional coil type GFCI would not be able to detect leakage due to the floating of Neutral from ground.

The isolation monitor between Neutral-GND would likely trip as a connection to the house is made, due to neutral and ground bonding at the house. To power a residential house or commercial building, the generator may require the system to disable the isolation monitor safety mechanism to allow house connection. In which the risk of a ground leakage fault would not have a detection mechanism or protection.

Figure 5:
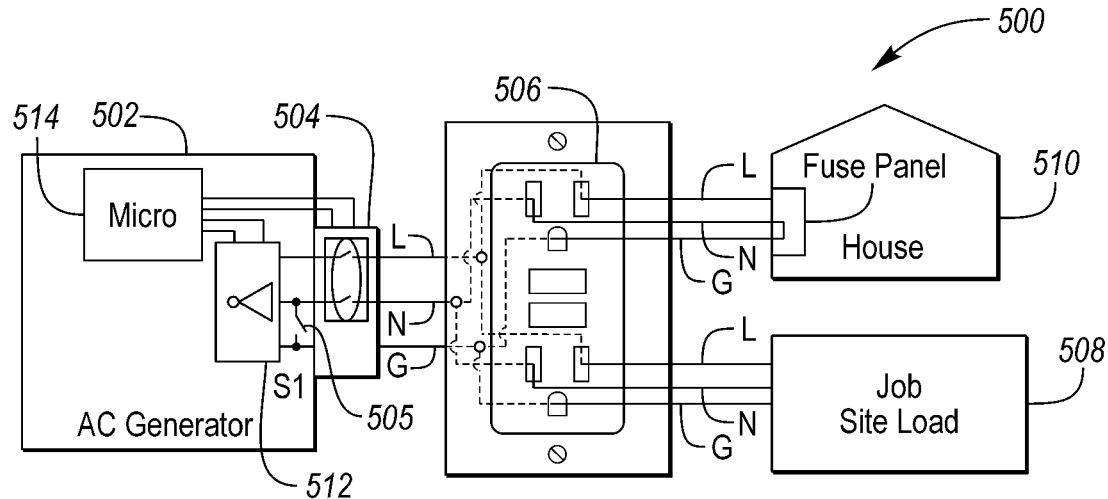
FIG. 5 is a schematic diagram of a generator connection with an isolation monitor and a switch between neutral and ground.

FIG. 5 is a schematic diagram of an AC generator system 500 connection with an isolation monitor and a switch between neutral and ground.

FIG. 5 is a schematic diagram of a generator system 500 with an isolation monitor S12 and a switch 505 between neutral and ground. The AC generator 502 is coupled with a Ground Fault Interrupter (GFI) circuit 504 and a receptacle 506 in which the neutral conductor (N) and ground conductor (G) may be selectively electrically connected via the switch 505. The AC generator further includes a controller S14 that may be coupled with the isolation monitor S12, switch 505, and GFCI 504. This system 500 is configurable such that when functioning for job site use 508, the switch S1 505 may be closed thereby shorting ground with neutral, as required by the Occupational Safety and Health Administration (OSHA) for job site use 508. Also, when the system 500 is functioning to provide emergency power for a residential house connection S10, switch S1 505 may be open. The open switch S1 505 isolates the neutral conductor from the ground conductor. In this configuration, the isolation monitor of Neutral to Ground is turned OFF due to the house connection, but the Line to GND monitor is still active to protect the customer from any High-Voltage current leak. Further, the GFCI is operable as a secondary protection device as ground is no longer a low impedance return path for fault current. The GFCI may trip when a fault current passes through the ground path.

The receptacle 506 is shown as an NEMA 5-20R but it may be of any common standard including a grounded version of international electrical receptacles such as NEMA 5-15R, 5-20R, L5-30R, L14-30R. Also, the generator may have multiple receptacles such as NEMA 5-20R and a NEMA L5-30R or a NEMA L14-30R. Further, the switch 505 may be coupled with a modified receptacle, (e.g., NEMA L5-30R or NEMA L14-30R) such that when a plug is mated with the modified receptacle, the switch 505 will be opened. The opening may be either mechanically (e.g., utilizes the insertion force to open the contactors of switch 505 or electrically (e.g., the controller detects the connection and outputs a signal to open the switch).

Figure 6:
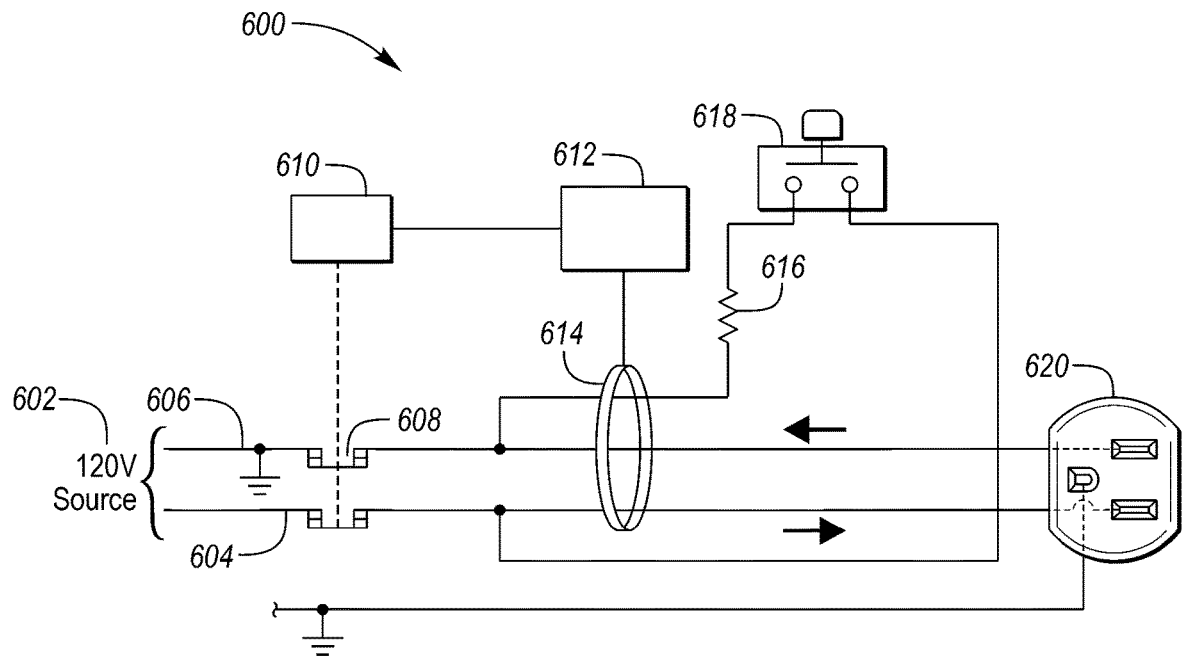
FIG. 6 is a schematic diagram of a ground fault interrupter use to detect line-to-ground or neutral-to-ground leakage faults.

FIG. 6 is a schematic diagram of a ground fault interrupter circuit 600 use to detect line-to-ground or neutral-to-ground leakage faults. The circuit 600 has an AC source 602 that has a line conductor 604 and a neutral conductor 606 and a disconnection switch 608 that can open disconnecting both the line conductor 604 and neutral conductor 606 from the receptacle 602. The switch is controlled by an actuator 610 and a controller 612 that receives feedback from a coil 614. When the current flowing through the line conductor 604 and neutral conductor 606 are equal, the field in the coil is balanced so the controller 612 maintains the switch 608 closed, however, if the currents are different, the controller 612 outputs a signal to open the switch 608. Also, to test the circuit, a resistor 616 flows a current outside of the coil 614 to force a difference in current between the line conductor 604 and neutral conductor 606 to test if the controller 612 detects the difference and signals the actuator 610 to open the switch 608.

Figure 7:
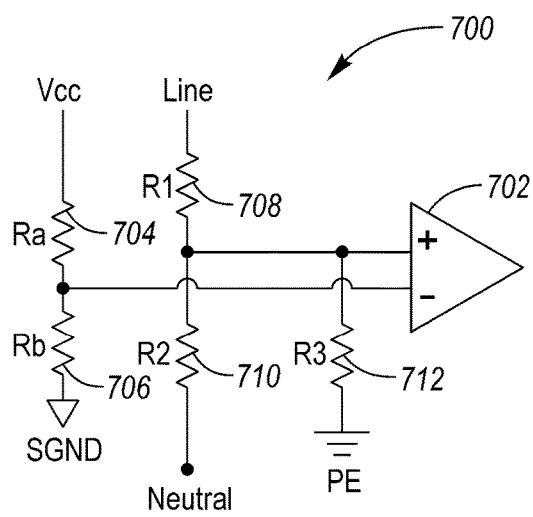
FIG. 7 is a schematic diagram of an isolation monitor configured to detect line-to-ground leakage faults.

FIG. 7 is a schematic diagram of an isolation monitor 700 configured to detect line-to-ground leakage faults. This circuit includes a comparator 702 and resistors Ra 704 and Rb 706 forming a reference voltage on the negative input and resistors R1 708 and R2 710 coupled between line and neutral in which the voltage at the comparator inputs may be represented by $$V_+ = V_{ac} * \frac{R2}{R1 + R2} \quad (1)$$

$$V_- = V_{cc} * \frac{Rb}{Ra + Rb} \quad (2)$$

In which Vac is the line to neutral voltage. Before a fault occurs between Line to Ground, the output of the comparator 702 is low. After a low impedance fault is present, V+ is shifted to a higher value and causing the comparator output to go high and trip the circuit as shown in FIG. 8.

Figure 8:
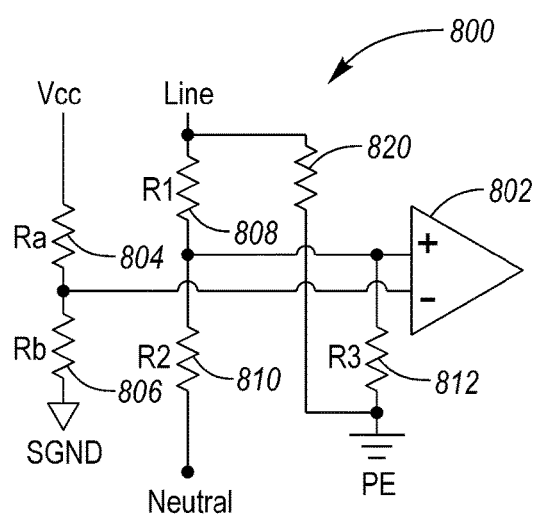
FIG. 8 is a schematic diagram of an isolation monitor with a line-to-ground leakage fault.

FIG. 8 is a schematic diagram of an isolation monitor 800 with a line-to-ground leakage fault 820. This circuit includes a comparator 802 and resistors Ra 804 and Rb 806 forming a reference voltage on the negative input and resistors R1 808 and R2 810 coupled between line and neutral in which the voltage at the comparator inputs may be represented by $$V_+ = V_{ac} * \frac{R2}{Rx + R2} \quad (3)$$

$$V_- = V_{cc} * \frac{Rb}{Ra + Rb} \quad (4)$$

In which Vac is the line to neutral voltage and Rx=R1//(Rf+R3)<<R1, where Rf represent a ground fault impedance. Before a fault occurs between Line to Ground, the output of the comparator 702 is low. After a low impedance fault is present, V+ is shifted to a higher value and causing the comparator output to go high and trip the circuit. The circuit of FIG. 7 may be used to detect a neutral to ground fault by swapping the line and neutral polarity between resistors R1 808 and R2 810.

Thus, two comparators are typically used to monitor Line to GND and Neutral to GND low impedance conditions. The fault impedance threshold is typically set to trip at a 5 mA equivalent in a 120V circuit, which is roughly 24 kΩ The isolation monitoring circuit may be limited to being only active when the neutral to ground bonding switch S1 is opened, as the GFCI may no longer be functional. Typically, the default configuration of switch S1 is closed, electrically coupling ground and neutral. If S1 is opened during the operation, then the isolation monitoring circuit will be activated immediately. If S1 is opened first for operation and then closed during operation, then the isolation monitoring circuit will trip due to detection of neutral and ground bonding requiring a reset of the circuit before restarting.

Here a switch S1 is used to open/close the connection between GND and Neutral for job site use and residential house back-up power. When in a standalone job site use, it is desirable to comply with OSHA requirement while keeping the GFCI as the primary protection device. The additional emergency residential house mode allows the customer to use the AC generator without tripping the ground fault protection, while maintaining protection of the customer from any High-Voltage leakage.

Control logic or functions performed by controller may be represented by flow charts or similar diagrams in one or more figures. These figures provide representative control strategies and/or logic that may be implemented using one or more processing strategies such as event-driven, interrupt-driven, multi-tasking, multi-threading, and the like. As such, various steps or functions illustrated may be performed in the sequence illustrated, in parallel, or in some cases omitted. Although not always explicitly illustrated, one of ordinary skill in the art will recognize that one or more of the illustrated steps or functions may be repeatedly performed depending upon the particular processing strategy being used. Similarly, the order of processing is not necessarily required to achieve the features and advantages described herein, but are provided for ease of illustration and description. The control logic may be implemented primarily in software executed by a microprocessor-based vehicle, engine, and/or powertrain controller, such as controller. Of course, the control logic may be implemented in software, hardware, or a combination of software and hardware in one or more controllers depending upon the particular application. When implemented in software, the control logic may be provided in one or more computer-readable storage devices or media having stored data representing code or instructions executed by a computer to control the vehicle or its subsystems. The computer-readable storage devices or media may include one or more of a number of known physical devices which utilize electric, magnetic, and/or optical storage to keep executable instructions and associated calibration information, operating variables, and the like.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
   an Alternating Current (AC) source having a line and neutral potential;
   a receptacle carried by a body of the vehicle and including line, neutral, and ground conductors, and a ground fault interrupter (GFI) circuit;
   a switch coupled between the AC source and the GFI circuit configured to selectively short the neutral and ground conductors; and
   a controller configured to, responsive to detection of a connection with a household fuse panel, close the switch to short the neutral conductor with the around conductor.

2. The vehicle of claim 1 further comprising an isolation monitor coupled with the GFI circuit, and wherein the controller is further configured to, responsive to detection of a connection with a household fuse panel, disable the isolation monitor.

3. The vehicle of claim 2, wherein the controller is further configured to, responsive to a connection with a household appliance, open the switch to enable the isolation monitor.

4. The vehicle of claim 1, wherein the controller is further configured to, responsive to a GFI fault while the switch is in a closed position, output a signal indicative of a request for a home connection mode.

5. The vehicle of claim 4, wherein the controller is further configured to disable an isolation monitor of neutral to ground.

6. The vehicle of claim 1, wherein the AC source line potential has an amplitude greater than 100 volts and less than 250 volts, and oscillates at a frequency greater than 40 Hz and less than 80 Hz.

7. The vehicle of claim 1, wherein the switch is a metal oxide semiconductor field effect transistor (MOSFET), bipolar junction transistor (BJT), or an insulated gate bipolar junction transistor (IGBT).

8. The vehicle of claim 1, wherein the receptacle is a NEMA L5-30R or a NEMA L14-30R, and is configured to, responsive to a plug mating with the receptacle, open the switch.

9. A method of controlling an Alternating Current (AC) generator for a vehicle comprising:
   by a controller,
      shorting, via a switch, a neutral line with a ground line of a receptacle carried by a body of the vehicle, and
      responsive to a difference between a line current and a neutral current exceeding a threshold, opening the switch, outputting a home connection mode signal, and disabling an isolation monitor between a neutral line and ground of the receptacle.

10. The method of claim 9 wherein the difference is output via a ground fault interrupter (GFI) circuit.

11. The method of claim 9 further comprising, responsive to detection of a connection with a household fuse panel, closing the switch to short a neutral conductor with a ground conductor.

12. The method of claim 9 further comprising, responsive to detection of a connection with a household fuse panel, disabling an isolation monitor.

13. The method of claim 9 further comprising, responsive to a connection with a household appliance, opening the switch to enable the isolation monitor.

14. The method of claim 9 further comprising, responsive to a NEMA L5-30R or a NEMA L14-30R plug mating with the receptacle, opening the switch.

15. A vehicle comprising:
   an inverter configured to output Alternating Current (AC) power at a line and neutral potential;

a receptacle carried by a body of the vehicle and including line, neutral, and ground conductors, and a ground fault interrupter (GFI) circuit;

a switch coupled between the inverter and the GFI circuit configured to selectively short the neutral and ground conductors; and a controller configured to, responsive to detection of a connection with a household fuse panel, close the switch to short the neutral conductor with the ground conductor.

16. The vehicle of claim 15, wherein the receptacle is a NEMA L5-30R or a NEMA L14-30R, and the controller is further configured to, responsive to a plug mating with the receptacle, open the switch.

17. The vehicle of claim 15, wherein the controller is further configured to, responsive to a GFI fault while the switch is in a closed position, output a signal indicative of a request for a home connection mode.

18. The vehicle of claim 15, wherein the AC line potential has an amplitude greater than 100 volts and less than 250 volts, and oscillates at a frequency greater than 40 Hz and less than 80 Hz.

* * * * *